(12) United States Patent
Doudoumopoulos

(10) Patent No.: US 6,740,870 B1
(45) Date of Patent: May 25, 2004

(54) CLEAR PLASTIC PACKAGING IN A CMOS ACTIVE PIXEL IMAGE SENSOR

(75) Inventor: Nicholas A. Doudoumopoulos, Marina del Rey, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/442,871

(22) Filed: Nov. 18, 1999

Related U.S. Application Data
(60) Provisional application No. 60/111,597, filed on Nov. 18, 1998.

(51) Int. Cl.[7] ................................................. H01J 40/14
(52) U.S. Cl. ....................................... 250/239; 257/433
(58) Field of Search ........................... 250/208.1, 239, 250/221; 257/433, 680, 684, 729, 788–794, 434, 80–85; 674/52.2–52.4; 438/25–29, 64–66

(56) References Cited

U.S. PATENT DOCUMENTS

| | | | | |
|---|---|---|---|---|
| 4,329,577 A | * | 5/1982 | Asano et al. | 250/201.2 |
| 4,827,118 A | * | 5/1989 | Shibata et al. | 250/228 |
| 5,122,045 A | * | 6/1992 | Tomisawa et al. | 425/116 |
| 5,289,002 A | * | 2/1994 | Tarn | 250/239 |
| 5,591,966 A | * | 1/1997 | Harada et al. | 250/239 |
| 5,811,797 A | * | 9/1998 | Kobachi et al. | 250/239 |
| 6,091,689 A | * | 7/2000 | Taniguchi et al. | 369/112.21 |
| 6,191,359 B1 | * | 2/2001 | Sengupta et al. | 174/52.3 |

* cited by examiner

*Primary Examiner*—Thanh X. Luu
(74) *Attorney, Agent, or Firm*—Dickstein Shaprio Morin & Oshinsky

(57) ABSTRACT

A photosensitive chip element is mounted in a totally clear package. The incoming fight can pass through the package at any angle. The incoming light passed through the package is sensed by the photosensor and converted to a signal indicative thereof. Since the package is clear, no special way of mounting the chip is necessary.

13 Claims, 3 Drawing Sheets

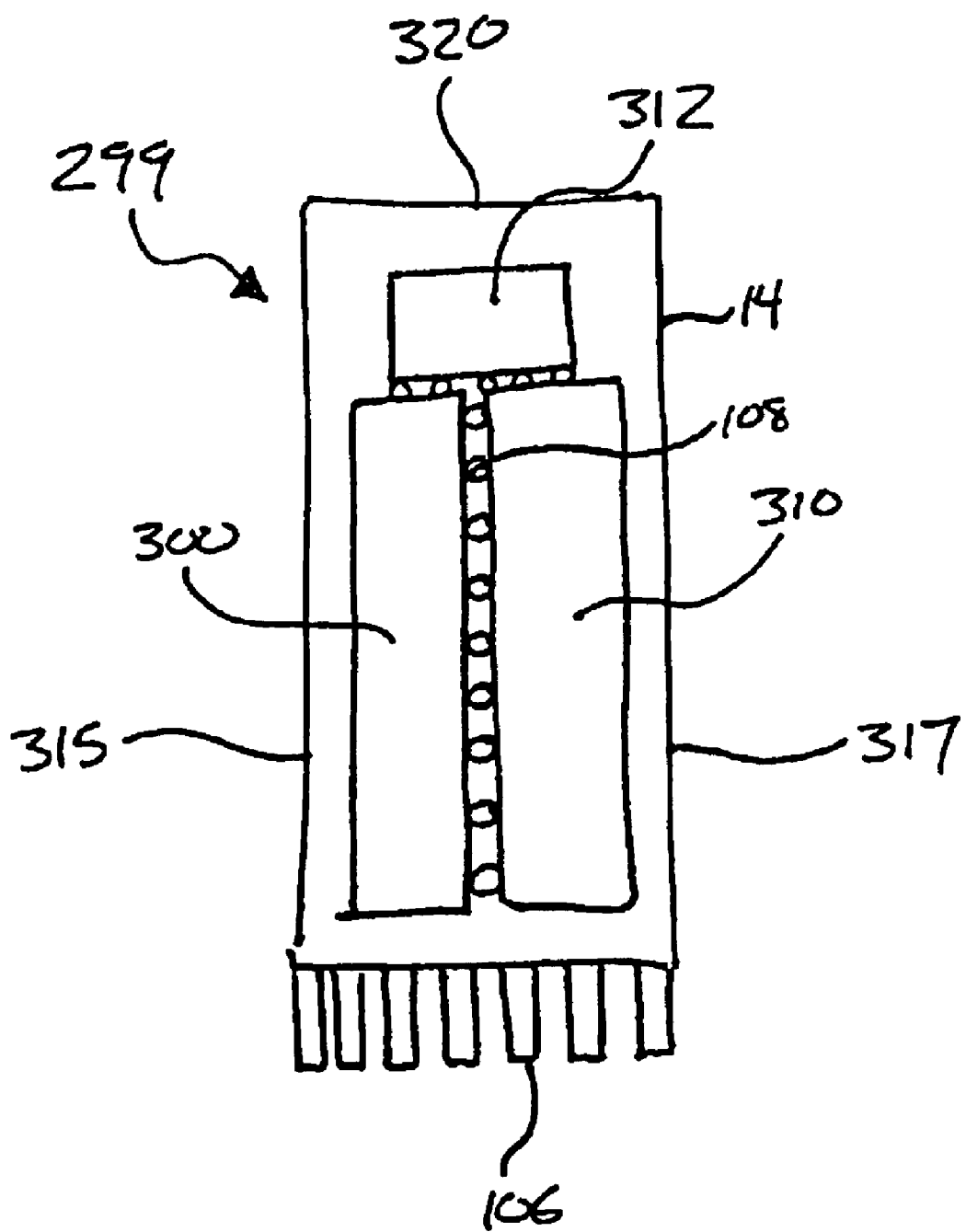

CLEAR PLASTIC PACKAGING IN A CMOS ACTIVE PIXEL IMAGE SENSOR

The present application claims priority under 35 U.S.C. § 119 from Provisional Application No. 60/111,597, filed Nov. 18, 1998.

FIELD OF THE INVENTION

The invention relates to CMOS imager devices and plastic packaging thereof.

BACKGROUND

Image sensors typically are formed using some kind of clear portion to allow light photons to enter the package. Other packaging techniques use plastic injection molds, blown plastics, or plastic transfer molds.

These techniques use a flow of plastic packing compound into a cavity. The cavity includes an imager die to be packaged, on a lead frame. Once cooled, the package part is removed from the mold, and the leads are trimmed or formed to form the final packaged part.

Typical materials used in the package molding have been opaque. These materials block incoming light. Hence, when these materials are used to package an optical component, they must be used in a way that does not interpose packaging material between the light and the component.

These prior art systems have been used with a preformed plastic cavity leadless chip carrier. Using these forms, however, results in higher package cost.

SUMMARY

The invention relates to packaging a photosensitive device in a clear package. More specifically, the photosensitive device can be a CMOS image sensor that is packaged in clear QFP (Quad Flat Package) or acrylic. The clear material allows the CMOS image sensor to be packaged in the same way as any other CMOS device. Since the material used to package the device is clear, the image sensor can be directly packaged in the package. This new packaging means results in lower cost devices that are more readily integrated with acrylic optics.

BRIEF DESCRIPTION OF THE DRAWINGS

These and other aspects will now be described in detail with respect to the accompanying drawings, wherein:

FIG. 3 shows a double sided image sensor in a packaging system in accordance with the invention.

DETAILED DESCRIPTION

The standard cavity mold approach used in CMOS is used according to the present application. The package is formed of clear structural plastic, such as QFP or an acrylic. Optionally, the entire package is transparent. The transfer mold approach is used in its standard way as is known in the art, but modified to use the melting and/or flow temperature for the QFP. The pressure and time in the mold are also modified according to the manufacturer's recommendations. The mold forming cavity may also be modified to allow for features and a different viscosity of the clear mold compound.

Figure 1:
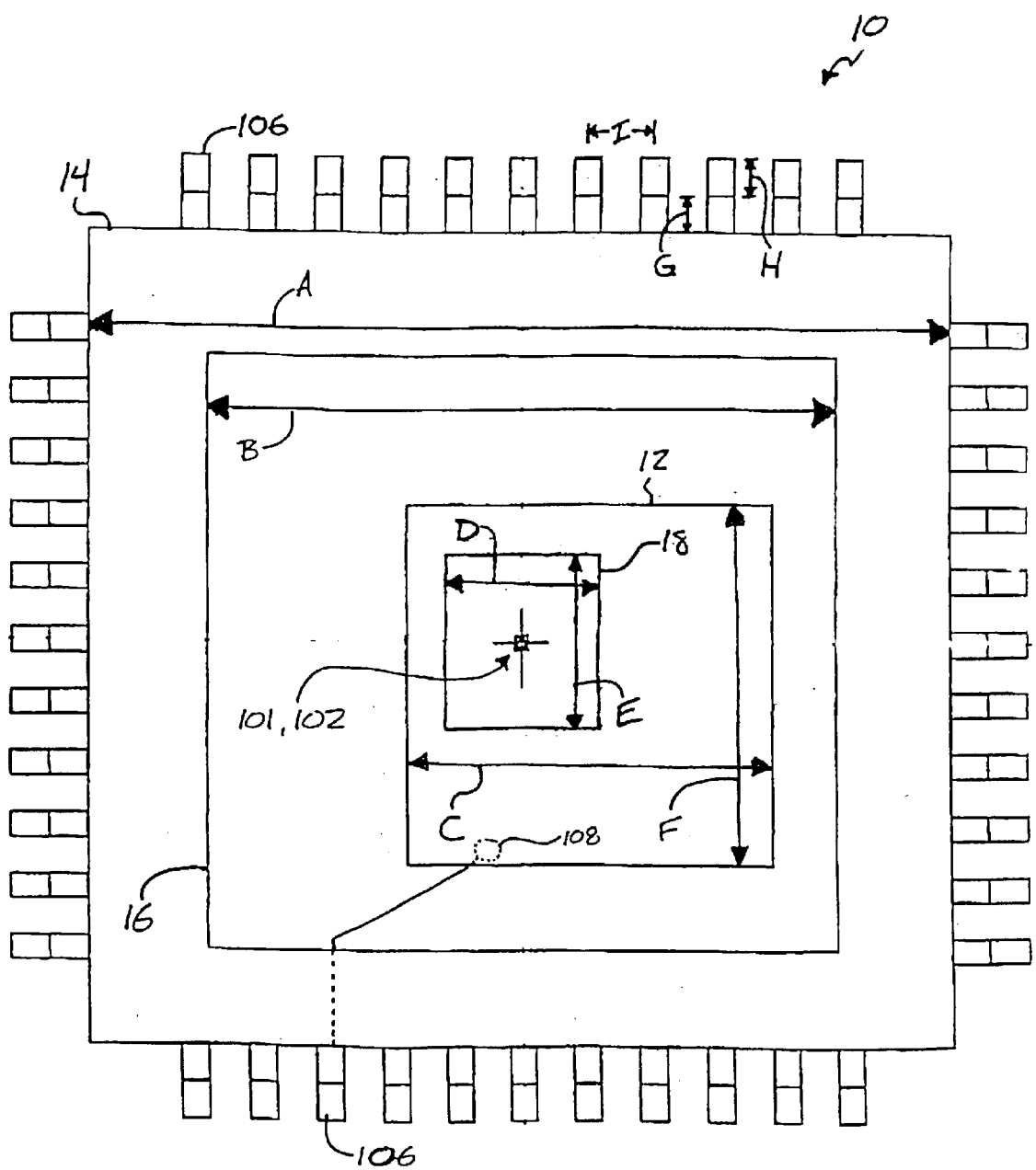
FIG. 1 shows a chip packaging system.

The final device forms a standard type CMOS die in a totally clear package as shown in FIG. 1. The CMOS dies, is, for example, a photosensitive device with electrical connections, for example, an active pixel sensor. The perimeter of the device has these electrical connections, which are connected to the electrical connections 108 on the image sensor chip.

FIG. 1 shows an exemplary embodiment of the package 14 of the invention and illustrates the different dimensions of the various package 10 features. As shown in FIG. 1, the package center 102 generally coincides with the imager array center 101. The package 14 has a number of different feature size parameters shown, including dimension "A" defining the overall package 14 width, which can be about 550 mils (0.550 inch). Dimension "B" defines an interior width of a cavity 16 for receiving the imager chip (e.g., die 12), which can be about 410 mils. Dimensions "C" and "F" define the imager chip widths, which can be about 239 mils and 224 mils, respectively. Dimensions "D" and "E" define the side lengths of the imager photo array 18, which can be about 112 mils and 92 mils, respectively. Dimension "G" defines the length of an electrical connection 106 measured from the edge of the package perimeter to the initiation of the electrical connection's 106 bend region; the dimension can be about 30 mils. Dimension "H" defines another length of the electrical connection 106 measured from the bend region to the electrical connection's 106 terminating end; the dimension can be about 15 mils. Dimension "I" defines a spacing length between adjacent electrical connection members 106 and can be about 39 mils.

FIG. 1 shows the package including different sizes of the different package parts. As shown in FIG. 1, the package center 102 is inside the array center 101. In addition, the package has a number of different size parameter shown including the size a witch's 550 mills, besides be witch's 410 mills, the size see which is 239 mills, the size of the witch's 112 mills, size the witch's 92 mills, the size F. witch is 224 mills, the size G. witch's 30 mills, the size age witch's 15 mills, and the size by a which in 39 mills.

Figure 2:
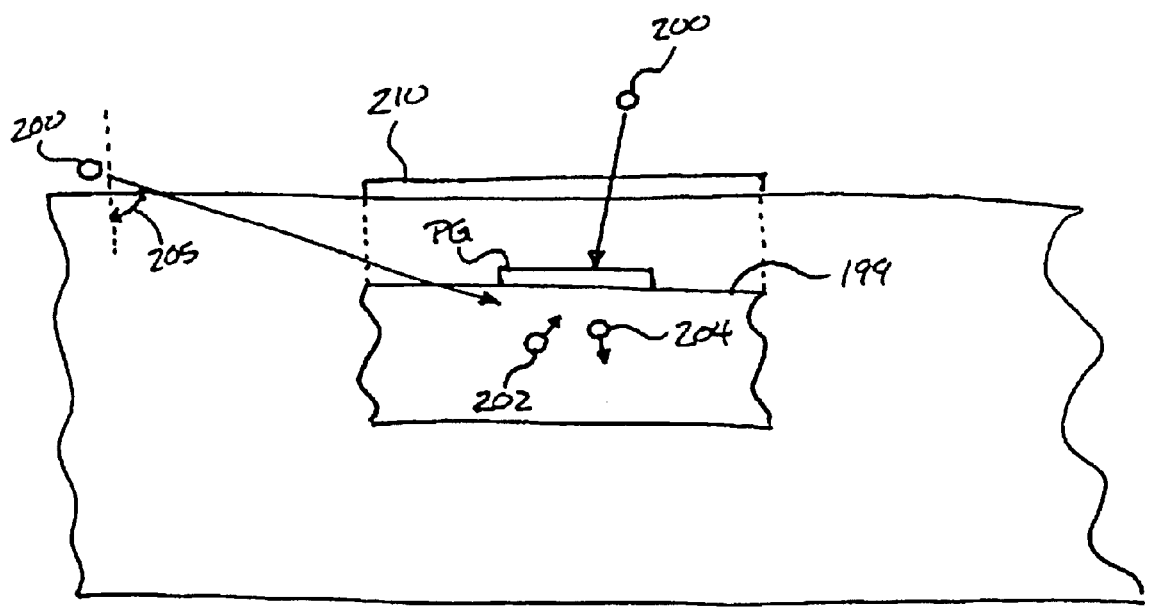
FIG. 2 shows an imager device in a packaging system as shown in FIG. 1 receiving incoming light.

As shown in FIG. 2, light photons 200 impinge the photodetector 199. These photons 200 can be accumulated in the silicon substrate under the photogate PG as 202, 204. The accumulated photons are stored as charge or some other form, which can be later read out. However, if the whole package is clear, as shown in FIG. 2, then photons 200 can be received from any conceivable angle relative to the photodetector 199, such as the angle shown as 205 in FIG. 2. A window, which would presumably be in the area shown as 210 in FIG. 2, would presumably block that photon.

Another application is shown in FIG. 3. The device is packaged with two image sensor elements 300 and 310, which respectively receive incoming light from two different sides 315, 317. Another image sensor 312 can receive light from the top 320. Since the package 299 is clear, the image sensors can be freely located within the package perimeter to receive incoming light from any direction.

Other modifications are contemplated. For example, other clear materials may be usable for packaging the chip.

What is claimed is:

1. A packaged photosensor device, comprising:

a first photosensor, said first photosensor comprising first electrical connections;

a second photosensor, said second photosensor comprising second electrical connections; and a clear plastic package supporting and enclosing said first and second photosensors, said clear plastic package comprising third electrical connections along an edge perimeter, said third electrical connections being electrically coupled to said first and second electrical connections, wherein said clear plastic package is transparent in all directions and said first and second photosensors are configured to receive light from at least two opposite sides of said clear plastic package.

2. A method of packaging an imager device, comprising:

providing an imager device;

forming a clear plastic quad flat package for said imager device, wherein said imager device is totally encased within said clear plastic quad flat package;

forming electrical connections between a perimeter of said clear plastic quad flat package and said imager device;

wherein said imager device is positioned to receive light that passes through said clear plastic quad flat package from any of a plurality of different incoming angles and through different surfaces of said clear plastic quad flat package.

3. A method of packaging an imager device, comprising:

providing a first image sensor;

providing a second image sensor;

forming a clear plastic package totally enclosing said first image sensor and said second image sensor; and providing electrical connections between said first and second image sensors and a perimeter of said clear plastic package;

wherein said first and second image sensors are positioned to receive light that passes through said clear plastic package, said first image sensor being positioned to acquire light from a first direction and said second image sensor being positioned to acquire light from a second direction different from said first direction.

4. An image sensor, comprising:

a first image sensor;

a second image sensor;

a third image sensor; and a clear plastic package enclosing said first, second, and third image sensors, said clear plastic package and said first, second, and third image sensors configured for acquiring light through a first side, a second side, and a third side of said clear plastic package respectively, wherein said first, second, and third sides of said clear plastic package are different sides.

5. A sensor as in claim 4, wherein said clear plastic package has a perimeter surrounding said first, second, and third image sensors, said perimeter including and edge comprising electrical connections coupled to said first, second, and third image sensors.

6. An image sensor as in claim 4, wherein said first, second, and third image sensors are CMOS image sensors.

7. An image sensor as in claim 4, wherein said first, second, and third image sensors acquire said image using photogates.

8. An imager device, comprising:

a clear package, said clear package comprising an outer perimeter and an internal cavity defined within said outer perimeter, said outer perimeter comprising a plurality of first electrical connections; and an imager die within said internal cavity, said imager die comprising an image sensor and a plurality of second electrical connections coupled to said plurality of first electrical connections, wherein said clear package completely surrounds said imager die and is transparent in all directions.

9. An imager device as in claim 8, wherein said clear package is a quad flat package.

10. An imager device as in claim 8, wherein said clear package comprises acrylic.

11. An imager device as in claim 8, wherein said image sensor is a CMOS imager array.

12. An imager device as in claim 8, wherein said plurality of first electrical connections extends around said perimeter.

13. An imager device as in claim 8, further comprising a window configured to block photons from said image sensor.

* * * * *

UNITED STATES PATENT AND TRADEMARK OFFICE
CERTIFICATE OF CORRECTION

PATENT NO. : 6,740,870 B1
APPLICATION NO. : 09/442871
DATED : May 25, 2004
INVENTOR(S) : Nick Doudoumopoulos It is certified that error appears in the above-identified patent and that said Letters Patent is hereby corrected as shown below:

Title page,
Item [57], ABSTRACT,
Line 2, "fight" should read -- light --.

Column 1, line 66 thru Column 2, line 5,
Replace with the following:
-- The final device 10 forms a standard type CMOS die 12 in a clear package 14 as shown in Figure 1. The CMOS die 12 is, for example, a photosensitive device, for example, an active pixel sensor, with a plurality of electrical connections 108 for electrical signal transfer. The perimeter of the packaged device has electrical connections 106, which are electrically coupled to the electrical connections 108 of the image sensor chip. --.

Column 2,
Lines 29-37, delete in its entirety.

Column 4,
Line 8, "and edge" should read -- an edge --.

Signed and Sealed this

Eleventh Day of July, 2006

JON W. DUDAS
*Director of the United States Patent and Trademark Office*